(12) United States Patent
Hanaoka

(10) Patent No.: US 7,714,410 B2
(45) Date of Patent: May 11, 2010

(54) SEMICONDUCTOR DEVICE

(75) Inventor: Terunao Hanaoka, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/115,578

(22) Filed: May 6, 2008

(65) Prior Publication Data

US 2008/0277758 A1    Nov. 13, 2008

(30) Foreign Application Priority Data

May 11, 2007    (JP)    ............... 2007-126717

(51) Int. Cl.
*H01L 27/00*    (2006.01)
*H01F 5/00*    (2006.01)

(52) U.S. Cl. ..................... 257/531; 336/200

(58) Field of Classification Search ............... 257/531, 257/E27.013, E27.001, E21.022; 438/703, 438/129, 128; 336/200, 205, 208, 84 M
See application file for complete search history.

(56) References Cited

U.S. PATENT DOCUMENTS

| | | | |
|---|---|---|---|
| 4,833,288 A * | 5/1989 | Poumey | ............ 219/622 |
| 6,707,153 B2 | 3/2004 | Kuwabara et al. | |
| 6,940,160 B1 | 9/2005 | Hanaoka et al. | |
| 2005/0116317 A1 * | 6/2005 | Lee et al. | ............... 257/531 |
| 2007/0013062 A1 * | 1/2007 | Kobayashi et al. | ............ 257/734 |
| 2007/0023862 A1 * | 2/2007 | Takagi | ............... 257/531 |

FOREIGN PATENT DOCUMENTS

| | | |
|---|---|---|
| JP | 11-307727 | 11/1999 |
| JP | 2000-101025 | 4/2000 |
| JP | 2004-153249 | 5/2004 |
| JP | 2004-281897 | 10/2004 |
| JP | 2005-26301 | 1/2005 |
| WO | WO00-55898 | 9/2000 |
| WO | WO01-71805 | 9/2001 |

* cited by examiner

*Primary Examiner*—Thomas L Dickey
*Assistant Examiner*—Nikolay Yushin
(74) *Attorney, Agent, or Firm*—Harness, Dickey & Pierce, P.L.C.

(57) ABSTRACT

A semiconductor device includes: a semiconductor substrate that has an integrated circuit and an electrode, the electrode being electrically coupled to the integrated circuit; a resin layer that is formed on the semiconductor substrate, the resin layer having an upper surface and a lower surface, the upper surface and the lower surface opposing each other, the lower surface facing the substrate; and a spiral inductor that is formed on the upper surface of the resin layer with a spiral wiring line, the spiral inductor being electrically coupled to the electrode. The wiring line has both ends in a width direction intersecting an axial line spirally extending and a midportion between the both ends. At least a part of the midportion makes contact with the upper surface of the resin layer, and at least the both ends are positioned apart from the upper surface of the resin layer.

5 Claims, 2 Drawing Sheets

SEMICONDUCTOR DEVICE

The entire disclosure of Japanese Patent Application No. 2007-126717, filed May 11, 2007 is expressly incorporated by reference herein.

BACKGROUND

1. Technical Field

The present invention relates to a semiconductor device and a method for manufacturing the same.

2. Related Art

Recently, a package called a wafer level CSP has been developed that includes a resin layer formed on a semiconductor chip, a wiring line formed on the resin layer, and an external terminal formed on the wiring line. For example, refer to JP-A-2005-26301. In addition, JP-A-2000-101025 discloses a spiral inductor formed with a spiral wiring line formed on a semiconductor chip. Spiral inductors need to increase the Q value thereof. In order to increase the Q value by reducing the resistance value of the wiring line, the thickness of the wiring line needs to be increased or the number of windings needs to be decreased, which is hardly attained in a limited space. Alternatively, the Q value may be increased by increasing the thickness of the resin layer between the semiconductor chip and the spiral wiring line to reduce capacitive coupling to silicon of the semiconductor chip. This way, however, inevitably results in the size of the semiconductor device being increased due to the resin thickness.

SUMMARY

An advantage of some aspects of the invention is to provide a semiconductor device including a spiral inductor having a high Q value with a compact size, and a method for manufacturing the same.

(1) According to a first aspect of the invention, a semiconductor device includes: a semiconductor substrate that has an integrated circuit and an electrode, the electrode being electrically coupled to the integrated circuit; a resin layer that is formed on the semiconductor substrate, the resin layer having an upper surface and a lower surface, the upper surface and the lower surface opposing each other, the lower surface facing the substrate; and a spiral inductor that is formed on the upper surface of the resin layer with a spiral wiring line, the spiral inductor being electrically coupled to the electrode. The wiring line has both ends in a width direction intersecting an axial line spirally extending and a mid-portion between the both ends. At least a part of the mid-portion makes contact with the upper surface of the resin layer, and at least the both ends are positioned apart from the upper surface of the resin layer.

According to the first aspect of the invention, a gap formed between the upper surface of the resin layer and the wiring line of the spiral inductor can reduce capacitive coupling to silicon of a semiconductor chip. As a result, the Q value of the spiral inductor can be increased without increasing the size.

(2) In the semiconductor device, the mid-portion may include a plurality of first portions that make contact with the upper surface of the resin layer and is provided along the axial line, and a second portion located between the first portions. The second portion may be positioned apart from the upper surface of the resin layer.

(3) The semiconductor device may further include a covering layer covering the resin layer and the wiring line. The covering layer may include a void formed so as to be adjacent to the upper surface of the resin layer and the wiring line.

(4) In the semiconductor device, the upper surface of the resin layer may be a convex curve in shape.

(5) The semiconductor device may further include a covering layer covering the resin layer and the wiring line. The upper surface may have a sloped region. The covering layer may include a void formed so as to be adjacent to the upper surface of the resin layer, one of the both ends of the wiring line in a downward side of the sloped region, and at least the part of the mid-portion of the wiring line, the part of the mid-portion making contact with the upper surface.

(6) In the semiconductor device, the upper surface of the resin layer may be a concave curve in shape.

(7) The semiconductor device may further include a covering layer covering the resin layer and the wiring line. The upper surface may have a sloped region. The covering layer may include a void formed so as to be adjacent to the upper surface of the resin layer, one of the both ends of the wiring line in a downward side of the sloped region, and at least the part of the mid-portion of the wiring line, the part of the mid-portion making contact with the upper surface.

(8) According to a second aspect of the invention, a semiconductor device includes: a semiconductor substrate that has an integrated circuit and an electrode, the electrode being electrically coupled to the integrated circuit; a resin layer that is formed on the semiconductor substrate, the resin layer having an upper surface and a lower surface, the upper surface and the lower surface opposing each other, the lower surface facing the substrate; and a spiral inductor that is formed on the upper surface of the resin layer with a spiral wiring line, the spiral inductor being electrically coupled to the electrode, and has a first portion and a second portion thicker than the first portion. The second portion makes contact with the resin layer while the first portion is positioned apart from the upper surface of the resin layer.

According to the second aspect of the invention, a gap formed between the upper surface of the resin layer and the first portion of the wiring line of the spiral inductor can reduce capacitive coupling to silicon of a semiconductor chip. As a result, the Q value of the spiral inductor can be increased without increasing the size.

(9) According to a third aspect of the invention, a method for manufacturing a semiconductor device includes: forming a resin layer on a semiconductor substrate having an integrated circuit and an electrode electrically coupled with the integrated circuit; forming a metal layer on the resin layer; and wet etching the metal layer to form a spiral inductor formed with a wiring line having both ends in a width direction intersecting an axial line spirally extending and a mid-portion between the both ends. The wet etching acts a lower layer, making contact with the resin layer, of the metal layer so as to develop side etching to form at least the both ends so as to be positioned apart from the resin layer with a gap interposed therebetween. The wet etching is finished before all the lower layer of the mid-portion are completely removed so that at least a part of the lower layer of the mid-portion remains.

According to the third aspect of the invention, the gap formed between the upper surface of the resin layer and the wiring line of the spiral inductor can reduce capacitive coupling to silicon of a semiconductor chip. As a result, the Q value of the spiral inductor can be increased without increasing the size.

(10) In the method, the wiring line may be formed so as to have a plurality of lands and a line portion connecting the plurality of lands and so that a width of each of the plurality of lands is wider than a width of the line portion, and the wet etching may be finished at when the lower layer of the mid-portion remains so as to make contact with the resin layer at the plurality of lands.

(11) In the method, the lower layer may be a TiW layer and a hydrogen oxide base etchant may be used in the wet etching of the metal layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
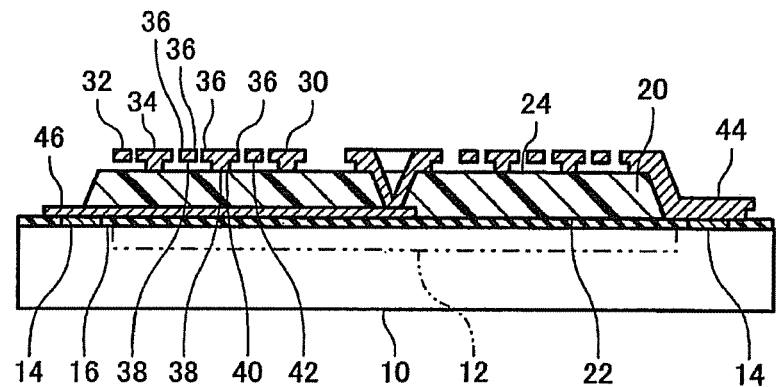
FIG. 1 is a sectional view illustrating a semiconductor device according to a first embodiment of the invention.

FIG. 1 is a sectional view illustrating a semiconductor device according to a first embodiment of the invention. A semiconductor substrate 10 is in a form of a semiconductor wafer as an interim product in manufacturing processes, and serves as a semiconductor chip in a semiconductor device as a final product. The semiconductor substrate 10 has an integrated circuit 12 (the semiconductor chip includes one integrated circuit 12 while the semiconductor wafer includes a plurality of integrated circuits 12). The semiconductor substrate 10 has a plurality of electrodes 14 electrically coupled with the integrated circuit 12 with internal wiring lines formed inside thereof. The semiconductor substrate 10 has a passivation film 16 formed so as to expose at least a part of the electrodes 14.

A resin layer 20 is formed to the surface, on which electrodes 14 are formed, of the semiconductor substrate 10. The resin layer 20 has a lower surface 22 and an upper surface 24. The lower surface 22 facing the surface, on which the electrodes 14 are formed, of the semiconductor substrate 10 while the upper surface 24 is opposite to the lower surface 22. The resin layer 20 is made of a polyimide resin, for example.

Figure 2:
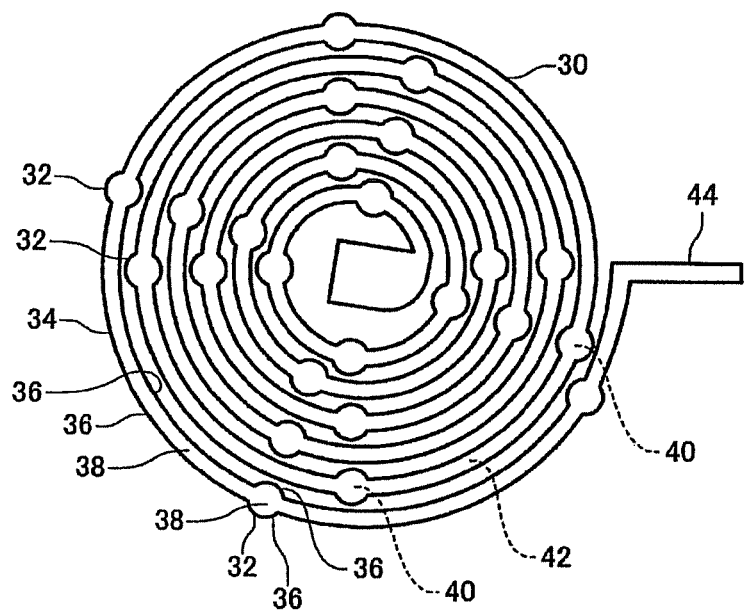
FIG. 2 is a plan view illustrating a spiral inductor of the semiconductor device according to the first embodiment of the invention.
Figure 3:
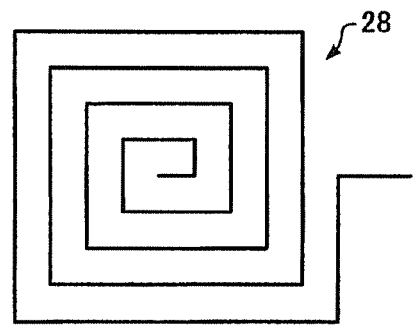
FIG. 3 is an explanatory view illustrating a modification of the spiral inductor shown in FIG. 2.

FIG. 2 is a plan view illustrating a spiral inductor of the semiconductor device according to the first embodiment of the invention. The spiral inductor is formed on the upper surface 24 of the resin layer 20. On the upper surface 24, being a flat surface, the spiral inductor only extends two-dimensionally. The spiral inductor is formed with a wiring line 30 having a spiral form. While the wiring line 30 is formed along an axial line curving and having a spiral shape as an example shown in FIG. 2, the wiring line may be formed along an axial line 28 having a rectangular spiral shape, composed of a straight line and a right-angle bended portion, as an modification example shown in FIG. 3.

The wiring line 30 includes a plurality of lands 32 and a line portion 34 connecting the plurality of lands 32. The width of each land 32 (the width in a direction intersecting the axial line spirally extending) is formed so as to be wider than that of the line portion 34. The wiring line 30 includes both ends 36 in the width direction and a mid-portion 38 between the both ends 36. The mid-portion 38 includes a plurality of first portions 40 and a plurality of second portions 42, each located between the first portions 40. The plurality of first portions 40 is provided along the axial line with a distance. The width of the line 30 passing the first portion 40 (the width of the land 32) is wider than that passing the second portion 42 (the width of the line portion 34). At least a part of the mid-portion 38 (e.g., the plurality of first portions 40) makes contact with the upper surface 24 of the resin layer 20. A part of the wiring line 30 (e.g., the second portions 42 of the mid-portion 38) and the upper surface 24 of the resin layer 20 form a gap therebetween. The both ends 36 are positioned apart from the upper surface 24 of the resin layer 20 with a gap interposed therebetween.

The spiral inductor is electrically coupled to the electrodes 14. For example, a first connecting wiring line 44 is extended from an end at the outside of the wiring line 30 of the spiral inductor is electrically coupled to one of the electrodes 14. Another end at the inside of the wiring line 30 is extended through a through hole formed in the resin layer 20 to electrically coupled to a second connecting wiring line 46 disposed under the resin layer 20. The second connecting wiring line 46 is electrically coupled to another one of the electrodes 14.

A method for manufacturing the semiconductor device of the embodiment, the resin layer 20 is formed to the surface, on which the electrodes 14 are formed, of the semiconductor substrate 10. The resin layer 20 is formed so as to have the through hole. Photolithography may be used for forming the resin layer 20.

Then, the spiral inductor is formed on the resin layer 20. For example, the spiral inductor is formed by the following manner. A TiW film (metal layer) is formed on the resin layer 20 by sputtering or the like. A copper (Cu) film (metal layer) is formed on the TiW film by sputtering or the like. A plating resist is formed on the Cu film, and then, electro plating is carried out to form a Cu-plated layer (metal layer) having a shape including that of the spiral inductor. Subsequently, the TiW film and the Cu film are etched with the Cu-plated layer as an etching resist. Wet etching using an etchant such as a hydrogen peroxide base is employed for etching them. The wet etching acts the TiW layer contacted with the resin layer (as the lower layer) to develop side etching. As a result, the both ends 36 of the wiring line 30 are positioned apart from the resin layer 20. The wet etching is finished before all the TiW layer (lower layer) of the mid-portion 38 are completely removed by side etching, so that at least a part of the TiW layer (lower layer) of the mid-portion 38 remains.

In the embodiment, even when the TiW layer of the line portion 34 is completely removed by side etching, the TiW layer of the mid-portion 38 (the first portions 40) remains since the width of the land 32 is wider than that of the line portion 34. The wet etching is finished so that the TiW layer of the mid-portion 38 remains to make contact with the resin layer 20 at the land portions 32.

In the embodiment, a gap is formed between the wiring line 30 of the spiral inductor and the upper surface 24 of the resin layer 20. Since the permittivity of the gap is smaller than that of the resin layer 20, capacitive coupling to silicon of the semiconductor chip can be reduced. As a result, the Q value of the spiral inductor can be increased without increasing the size.

The method for manufacturing the semiconductor device of the embodiment may additionally include known structures and processes. The method for manufacturing the semiconductor device of the embodiment also includes processes apparently derived from the structure of the above-described semiconductor device.

Figure 4:
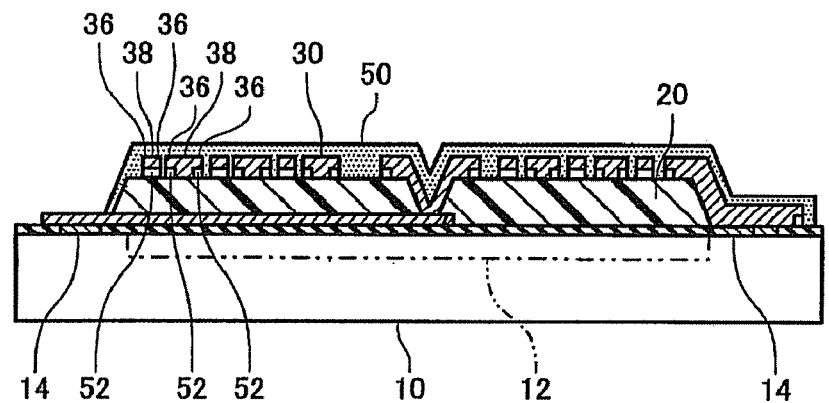
FIG. 4 shows another embodiment of the semiconductor device shown in FIG. 1. In the embodiment, the semiconductor device further includes a covering layer.

FIG. 4 shows another embodiment of the semiconductor device shown in FIG. 1. In the embodiment, the semiconductor device further includes a covering layer 50. That is, the semiconductor device further includes the covering layer 50 to cover the resin layer 20 and the wiring line 30. The covering layer 50 is formed with a resin. The covering layer 50 includes a void 52 formed under the both ends 36 (positioned apart from the resin layer 20) of the wiring line 30. The covering layer 50 includes the void 52 formed under the portion, which is positioned apart from the resin layer 20, of the mid-portion 38 of the wiring line 30. The void 52 is adjacent to the upper surface 24 of the resin layer 20 and the wiring line 30. Specifically, in the wiring line 30, the void 52 is adjacent to the both ends 36 and the lower surface of the mid-portion 38 at the line portion 34 positioned apart from the resin layer 20, while, at the land 32, the lower surface of the both ends 36 and the side surface of the mid-portion 38.

Increasing the viscosity of a resin precursor for forming the covering layer 50 helps the resin precursor not to easily enter the gap between the wiring line 30 and the resin layer 20. As a result, the voids 52 are formed in the covering layer 50. Here, if the permittivity of the covering layer 50 is smaller than that of the resin layer 20, the capacitive coupling to silicon of the semiconductor chip can be reduced even if a part of the covering layer 50 enters the gap.

Second Embodiment

Figure 5:
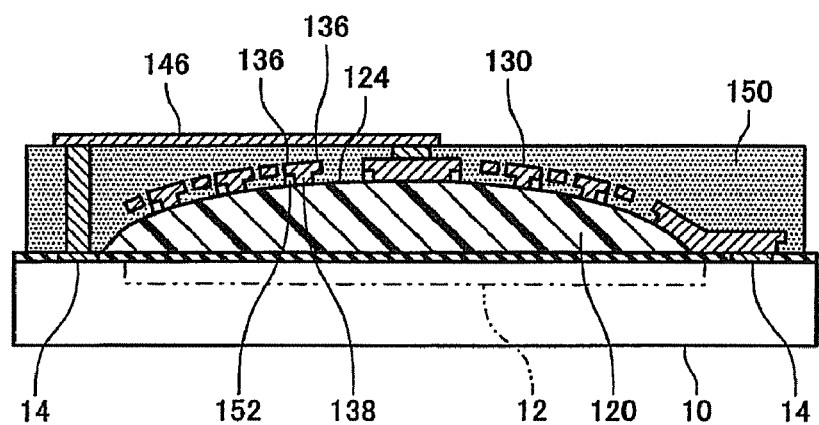
FIG. 5 is a sectional view illustrating a semiconductor device according to a second embodiment of the invention.

FIG. 5 is a sectional view illustrating a semiconductor device according to a second embodiment of the invention. In the second embodiment, a covering layer 150 covers a resin layer 120 and a wiring line 130. An upper surface 124 of the resin layer 120 shows a convex curve. An end at the inside of the wiring line 130 is extended through a through hole formed in the covering layer 150 to electrically coupled to a second connecting wiring line 146 disposed on the covering layer 150. The second connecting wiring line 146 is electrically coupled to one of the electrodes 14 through a through hole formed in the resin layer 120.

The upper surface 124 of the resin layer 120 includes a sloped region. The resin precursor for forming the covering layer 150 flows downward in the sloped region and stops at a part, which makes contact with the resin layer 120, of a mid-portion 138 of the wiring line 130. Accordingly, the resin precursor tends to accumulate in an upward side from the part, which makes contact with the resin layer 120, of the mid-portion 138 of the wiring line 130 while in a downward side, the resin precursor hardly accumulates. As a result, a void 152 is formed in the covering layer 150. The void 152 is adjacent to the upper surface 124 of the resin layer 120, one of the both ends 136 of the wiring line 130 in a downward side of the sloped region, and the part, which makes contact with the upper surface 124, of the mid-portion 138 of the wiring line 130. Other structures and effects of the embodiment are the same as those described in the first embodiment. A method for manufacturing the semiconductor device of the embodiment is also the same as that of the first embodiment.

Third Embodiment

Figure 6:
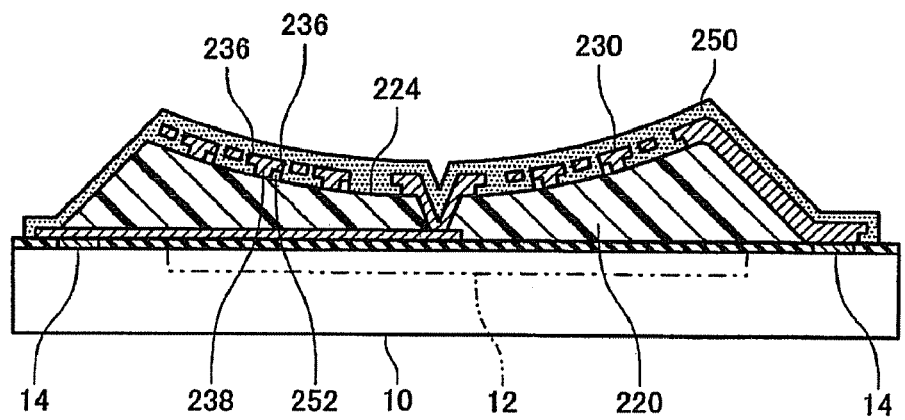
FIG. 6 is a sectional view illustrating a semiconductor device according to a third embodiment of the invention.

FIG. 6 is a sectional view illustrating a semiconductor device according to a third embodiment of the invention. In the third embodiment, a covering layer 250 covers a resin layer 220 and a wiring line 230. An upper surface 224 of the resin layer 220 shows a concave curve. The upper surface 224 of the resin layer 220 includes a sloped region. A resin precursor for forming the covering layer 250 flows downward in the sloped region and stops at a part, which makes contact with the resin layer 220, of a mid-portion 238 of the wiring line 230. Accordingly, the resin precursor tends to accumulate in an upward side from the part, which makes contact with the resin layer 220, of the mid-portion 238 of the wiring line 230 while in a downward side, the resin precursor hardly accumulates. As a result, a void 252 is formed in the covering layer 250. The void 152 is adjacent to the upper surface 224 of the resin layer 220, an end of the both ends 236 of the wiring line 230 in a downward side of the sloped region, and the part, which makes contact with the upper surface 224, of the mid-portion 238 of the wiring line 230. Other structures and effects of the embodiment are the same as those described in the first embodiment. A method for manufacturing the semiconductor device of the embodiment is also the same as that of the first embodiment.

The invention is not limited to the aforementioned embodiments, but various modifications thereof are possible. For example, the invention includes substantially the same structures as described in the embodiments (e.g., structures with the same functions, ways, and results or structures with the same objects and results). In addition, the invention includes structures obtained by replacing a nonessential part of the structure described in the embodiments. Further, the invention includes structures offering the same actions and results or structures achieving the same objects as of the structure described in the embodiments. Still further, the invention includes structures obtained by adding prior art with the structures described in the embodiments.

What is claimed is:

1. A semiconductor device, comprising:
   a semiconductor substrate that has an integrated circuit and at least a first electrode and a second electrode, the first and second electrodes being electrically coupled to the integrated circuit;
   a resin layer that is formed on the semiconductor substrate, the resin layer having an upper surface and a lower surface, the upper surface and the lower surface opposing each other, the lower surface facing the substrate; and
   a spiral inductor that is formed on the upper surface of the resin layer with a spiral wiring line, the spiral inductor including a first terminal end electrically coupled to the first electrode and a second terminal end electrically coupled to the second electrode, the wiring line having edges in a width direction between the first and second terminal ends and a mid-portion between the edges,
   wherein at least a part of the mid-portion makes contact with the upper surface of the resin layer such that the edges are positioned apart from the upper surface of the resin layer by a gap.

2. The semiconductor device according to claim 1, the mid-portion including a plurality of first portions and a second portion, the plurality of first portions making contact with the upper surface of the resin layer, and the second portion being located between the first portions, the second portion being positioned apart from the upper surface of the resin layer by another gap.

3. The semiconductor device according to claim 1, further comprising:
   a covering layer that covers the resin layer and the wiring line, the covering layer including a void formed so as to be adjacent to the upper surface of the resin layer and the wiring line defined by the gaps.

4. A semiconductor device, comprising:
a semiconductor substrate that has an integrated circuit and an electrode, the electrode being electrically coupled to the integrated circuit;
a resin layer that is formed on the semiconductor substrate, the resin layer having an upper surface and a lower surface, the upper surface and the lower surface opposing each other, the lower surface facing the substrate;
a spiral inductor that is formed on the upper surface of the resin layer with a spiral wiring line, the spiral inductor being electrically coupled to the electrode, the wiring line having ends in a width direction and a mid-portion between the ends, at least a part of the mid-portion making contact with the upper surface of the resin layer such that the ends are positioned apart from the upper surface of the resin layer; and
a covering layer that covers the resin layer and the wiring line, the upper surface having a sloped region, the covering layer including a void formed so as to be adjacent to the upper surface of the resin layer, one of the ends of the wiring line in a downward side of the sloped region, and at least the part of the mid-portion of the wiring line, the part of the mid-portion making contact with the upper surface,
wherein the upper surface of the resin layer being a convex curve in shape.

5. A semiconductor device, comprising;
a semiconductor substrate that has an integrated circuit and an electrode, the electrode being electrically coupled to the integrated circuit;
a resin layer that is formed on the semiconductor substrate, the resin layer having an upper surface and a lower surface, the upper surface and the lower surface opposing each other, the lower surface facing the substrate;
a spiral inductor that is formed on the upper surface of the resin layer with a spiral wiring line, the spiral inductor being electrically coupled to the electrode, the wiring line having ends in a width direction and a mid-portion between the ends, at least a part of the mid-portion making contact with the upper surface of the resin layer such that the ends are positioned apart from the upper surface of the resin layer; and
a covering layer that covers the resin layer and the wiring line, the upper surface having a sloped region, the covering layer including a void formed so as to be adjacent to the upper surface of the resin layer, one of the ends of the wiring line in a downward side of the sloped region, and at least the part of the mid-portion of the wiring line, the part of the mid-portion making contact with the upper surface,
wherein the upper surface of the resin layer being a concave curve in shape.

* * * * *